(12) United States Patent
Spoerke et al.

(10) Patent No.: US 10,002,983 B1
(45) Date of Patent: Jun. 19, 2018

(54) NANOCOMPOSITE BARRIER FILMS FOR PHOTOVOLTAIC APPLICATIONS

(71) Applicants: National Technology & Engineering Solutions of Sandia, LLC, Albuquerque, NM (US); Jaime C. Grunlan, College Station, TX (US)

(72) Inventors: Erik David Spoerke, Albuquerque, NM (US); Margaret Ellen Gordon, Albuquerque, NM (US); Eric John Schindelholz, Albuquerque, NM (US); Kenneth Miguel Armijo, Albuquerque, NM (US); Neil R. Sorensen, Albuquerque, NM (US); Anthony Martino, Albuquerque, NM (US); Jaime C. Grunlan, College Station, TX (US)

(73) Assignee: National Technology & Engineering Solutions of Sandia, LLC, Albuquerque, NM (US)

( * ) Notice: Subject to any disclaimer, the term of this patent is extended or adjusted under 35 U.S.C. 154(b) by 0 days. days.

(21) Appl. No.: 15/603,877

(22) Filed: May 24, 2017

Related U.S. Application Data

(60) Provisional application No. 62/342,090, filed on May 26, 2016.

(51) Int. Cl.
*H01L 31/048* (2014.01)
*C08K 3/34* (2006.01)
*C08L 79/02* (2006.01)
*C08L 33/02* (2006.01)

(52) U.S. Cl.
CPC .......... *H01L 31/0481* (2013.01); *C08K 3/346* (2013.01); *C08L 33/02* (2013.01); *C08L 79/02* (2013.01); *C08L 2203/204* (2013.01)

(58) Field of Classification Search
CPC ... H01L 31/048; H01L 31/0481; C08K 3/346; C08L 33/02; C08L 79/02; C08L 2203/204
See application file for complete search history.

(56) References Cited

U.S. PATENT DOCUMENTS

| 2011/0120546 | A1* | 5/2011 | Nesbitt et al. |
| 2014/0069497 | A1* | 3/2014 | Hwang et al. |
| 2015/0243928 | A1* | 8/2015 | Grunlan et al. |
| 2016/0264820 | A1* | 9/2016 | Kikuchi et al. |

OTHER PUBLICATIONS

Gaume, J. et al., "Optimization of PVA clay nanocomposite for ultra-barrier multilayer encapsulation of organic solar cells", Solar Energy Materials & Solar Cells 99 (2012) pp. 240-249.
(Continued)

*Primary Examiner* — Susan Dang Leong
(74) *Attorney, Agent, or Firm* — Kevin W. Bieg

(57) ABSTRACT

Polymer-clay nanocomposites thin film coatings have improved water vapor and oxygen permeability, in addition to improved corrosion resistance, while retaining high transparency, high electrical resistivity, and excellent fire-retardant properties for use as encapsulants for photovoltaic module assemblies and barrier coatings in other photovoltaic applications.

13 Claims, 2 Drawing Sheets

(56) References Cited

OTHER PUBLICATIONS

Kunz, D.A. et al., "Clay-Based Nanocomposite Coating for Flexible Optoelectronics Applying Commercial Polymers", ACS Nano, vol. 7, No. 5 (2013) pp. 4275-4280.

Laufer, G. et al., "Clay-Chitosan Nanobrick Walls: Completely Renewable Gas Barrier and Flame-Retardant Nanocoatings", ACS Applied Materials & Interfaces, ACS Appl. Mater. Interfaces, vol. 4 (2012), pp. 1643-1649.

Leonard, J.K. et al., "Synthesis and Thermal Characterization of Precision Poly(ethyleneco-vinyl Amine) Copolymers", Macromolecules, vol. 45 (2012), pp. 671-680.

Li, Y-C. et al., "Flame Retardant Behavior of Polyelectrolyte-Clay Thin Film Assemblies on Cotton Fabric", ACS Nano, vol. 4, No. 8 (2010), pp. 3325-3337.

Priolo, M.A. et al., "Super Gas Barrier of Transparent Polymer-Clay Multilayer Ultrathin Films", Nano Lett., vol. 10 (2010), pp. 4970-4974.

Priolo, M.A. et al., "Transparency, Gas Barrier, and Moisture Resistance of Large-Aspect-Ratio Vermiculite Nanobrick Wall Thin Films", ACS Appl. Mater. Interfaces, vol. 4 (2012), pp. 5529-5533.

Umoren, S.A. et al., "Effect of polyacrylic acid on the corrosion behaviour of aluminium in sulphuric acid solution", J Solid State Electrochem, vol. 14 (2010), pp. 2293-2305.

Yang, Y-H. et al., "Improving oxygen barrier and reducing moisture sensitivity of weak polyelectrolyte multilayer thin fims with crosslinking", RSC Advances, vol. 2 (2012), pp. 12355-12363.

\* cited by examiner

US 10,002,983 B1

NANOCOMPOSITE BARRIER FILMS FOR PHOTOVOLTAIC APPLICATIONS

CROSS-REFERENCE TO RELATED APPLICATION

This application claims the benefit of U.S. Provisional Application No. 62/342,090, filed May 26, 2016, which is incorporated herein by reference.

STATEMENT OF GOVERNMENT INTEREST

This invention was made with Government support under Contract No. DE-NA0003525 awarded by the United States Department of Energy/National Nuclear Security Administration. The Government has certain rights in the invention.

FIELD OF THE INVENTION

The present invention relates to solar photovoltaic technology and, in particular, to nanocomposite barrier films for enhanced photovoltaic stability.

BACKGROUND OF THE INVENTION

Effective photovoltaic (PV) module encapsulation is central to the long-term reliability, extended functional device lifetime, and consumer safety required for the cost-effective large scale deployment of solar PV technology. Failure or degradation of encapsulant coatings protecting sensitive PV materials and electronics from environmental exposure is a leading cause of PV degradation and failure. Currently used glass barriers suffer from cracking or poor sealing and are not suitable for flexible applications. Current polymer encapsulants, such as ethylene vinyl acetate (EVA) in particular, are prone to degradation into harmful corrosive acid byproducts, discoloration, delamination, and unacceptable ingress of moisture, oxygen, and other corrosive gases that lead to secondary module component degradation. These encapsulant-related problems decrease PV power production, reduce module lifetimes, and introduce additional operational and maintenance costs, all of which threaten critical cost measures such as levelized cost of electricity (LCOE). Similar barrier problems also limit the lifetime and performance of light emitting diodes (LEDs).

Therefore, a need remains for a low-cost, optically transparent, electrically insulating, highly impermeable thin film coating for PV and LED applications.

SUMMARY OF THE INVENTION

The present invention is directed to a robust, low-cost, optically transparent, highly impermeable layered nanocomposite (LNC) thin barrier film for encapsulation of photovoltaic modules. The composite thin film barrier comprises organized composite layers, such as delaminated clay platelets, dispersed and oriented within a polyelectrolyte polymer matrix, that can be deposited using scalable layer-by-layer (LBL) processes. These composite thin films are transparent, flexible, conform to irregular shapes, and exhibit excellent oxygen/moisture exclusion. In particular, the highly controlled, nanoscale films and engineered clay/polymer chemistries of the present invention promise significant improvements in resistance to gas permeation, corrosion resistance, and unwanted ion transport. Moreover, fire retardant properties of these oxygen barriers introduce unprecedented protection against fires caused by device arc-faults. Finally, the thin film character of these materials makes them suitable for integration into existing PV manufacturing processes. By improving thin film PV stability and reliability, these nanocomposite encapsulants can significantly impact national photovoltaic priorities.

BRIEF DESCRIPTION OF THE DRAWINGS

The detailed description will refer to the following drawings, wherein like elements are referred to by like numbers.

DETAILED DESCRIPTION OF THE INVENTION

Effective solar PV encapsulants must not only serve as an effective barrier to deleterious oxygen, moisture, and other potentially corrosive gases, but these coatings must be stable to temperature variations and UV-light exposure. In the past several years, limited reports have described polymer-clay composites as barriers for organic photovoltaics or flexible electronics. See J. Gaume et al., *Solar Energy Mater. & Solar Cells* 99, 240 (2012); and D. Kunz et al., *ACS Nano* 7(5), 4275 (2013). These approaches are often aimed at replacing encapsulant materials (e.g., EVA) and are deposited using deposition techniques that result in relatively thick barrier films (micrometers to tens of micrometers), introducing potentially serious problems with sacrificial absorption and light scattering from these candidate encapsulants. The present invention uses clay and polymer building blocks to assemble polymer-clay nanocomposites (PCNs) that can be applied either as stand-alone encapsulants or in collaboration with existing PV materials for improved water vapor and oxygen permeability, while retaining high transparency, high electrical resistivity, and excellent fire-retardant properties. The PCN thin films can be used as barrier layer encapsulants for PV module assemblies and are not limited to organic PVs, but can be used with inorganic PVs (e.g., Si) or hybrid PVs (e.g., perovskite PV) as well.

Figure 1:
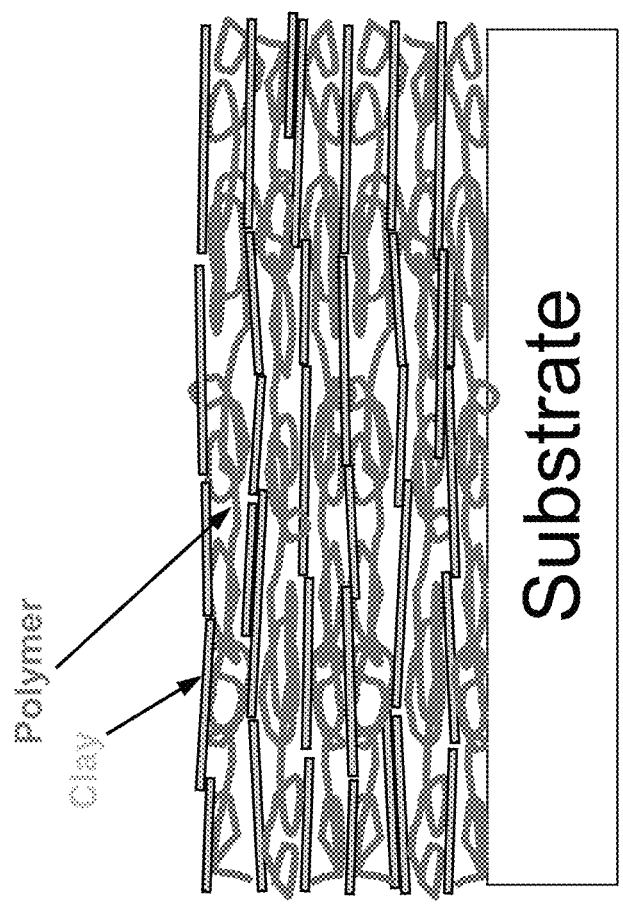
FIG. 1 is a schematic illustration of a layer-by-layer deposited polymer-clay nanocomposite with well dispersed and aligned clay platelets in a polymer matrix.

The PCN-enabled encapsulant technology is based on thin films comprising multiple layers of delaminated clay platelets, dispersed and oriented within a polyelectrolyte polymer matrix. The ordered polymer-clay nanocomposite thin film structure is schematically illustrated in FIG. 1. This thin film structure can be assembled through the layer-by-layer (LBL) deposition of alternating molecular layers of charged polymer (e.g., polyethyleneimine) and oppositely charged exfoliated clay platelets (e.g., montmorillonite (MMT) or vermiculite (VMT) or other large aspect ratio platelet materials (e.g, alumina, graphene, boron nitride, etc.). The clay composition, optical properties of the clay, degree of platelet exfoliation, and platelet aspect ratio can be optimized to affect assembly into PCN thin films that impact key barrier properties, such as gas permeation. Using MMT clays as an example, the clay chemistry and structure can be systematically varied to provide specific technical clay characteristics desirable in optimized PCN thin film barriers. These optimized clay materials can then be paired with engineered polymers to create complementary interactions in the PCN thin film structures. For example, the polymer can be commercially-available polyethyleneimines (PEI), which are strongly cationic. Other cationic polymer systems, such as the cationic equivalent to EVA, ethylene vinyl amine (a copolymer of ethylene and vinyl amine), can also be used. See J. Leonard et al., *Macromolecules* 45, 671 (2012). Alternatively, anionic polymers, such as poly(acrylic acid) (PAA) can be used together with cationic clays, such as layered double hydroxides (LDHs). In more advanced configurations, combinations of oppositely charged polymers (e.g, PEI and PAA) can be combined either with or without inorganic platelets, as a layered polyelectrolyte barrier. See M. A. Priolo et al., *Nano Lett.* 12, 4970 (2010) and Y-H Yang et al., *RSC Advances* 2, 12355 (2012). These mixed polymer systems also lend themselves to chemical crosslinking to increase the stability or tune the barrier properties of the composite films. In addition, incorporation of anionic polymers, such as PAA would be expected to have an independent influence reducing corrosion. See S. A. Umoren et al., *J Sol. St Electrochem.* 14(12), 2293 (2010).

The interactions between the layers need not be exclusively electrostatic. Other intermolecular interactions, including hydrogen bonding, amphiphlicity (solvation), or even covalent bonding can also be employed, through carefel selection of polymer and particle chemistries, to drive the organization and assembly of the composite structures. The nature of the inorganic "particle" layer need not be formed from discrete particles, either. Inclusion of inorganic phases, for example using atomic layer deposition to incorporate a layer or aluminum oxide (or other suitable material) into the LNC structure allows for further tuning of properties, such as moisture barrier properties.

In addition to the exemplary MMT-PEI coatings, engineered systems including modified clays and polymers can be incorporated into the thin film barriers. For example, the PCN films can be combined with current encapsulant materials (e.g., EVA) to improve overall module barrier and fire-retardant properties. Alternatively, the PCN films can be applied together with other EVA substitutes, such as polyvinyl butyral (PVB), polyolefins (POs), ionomers, or silicones to either enhance natural barrier properties of these encapsulants or maintain target gas barrier properties while reducing the quantity (e.g., thickness) of more expensive or less optically transparent materials. Such polymer systems combine the benefits of the PCN with positive attributes from EVA encapsulants (minus the formation of deleterious acidic decomposition byproducts). Further, these PCN-enhanced encapsulants can provide excellent barrier properties and improve arc-fault resistance without significantly increasing cost or requiring modifications to current module processing. By tailoring the composition of these copolymer materials, the morphology, chemistry, and associated barrier properties of the encapsulant PCN films can be influenced. The PCN thin films can be deposited on varied material substrates, including polymer, metal, and silica (e.g., glass) substrates. Indeed, the PCN coatings can be applied to virtually any PV system (e.g., Si, CdTe, CIGS, OPV, perovskite PV, DSSCs, or any other cell) that requires protection from the environment.

Figure 2:
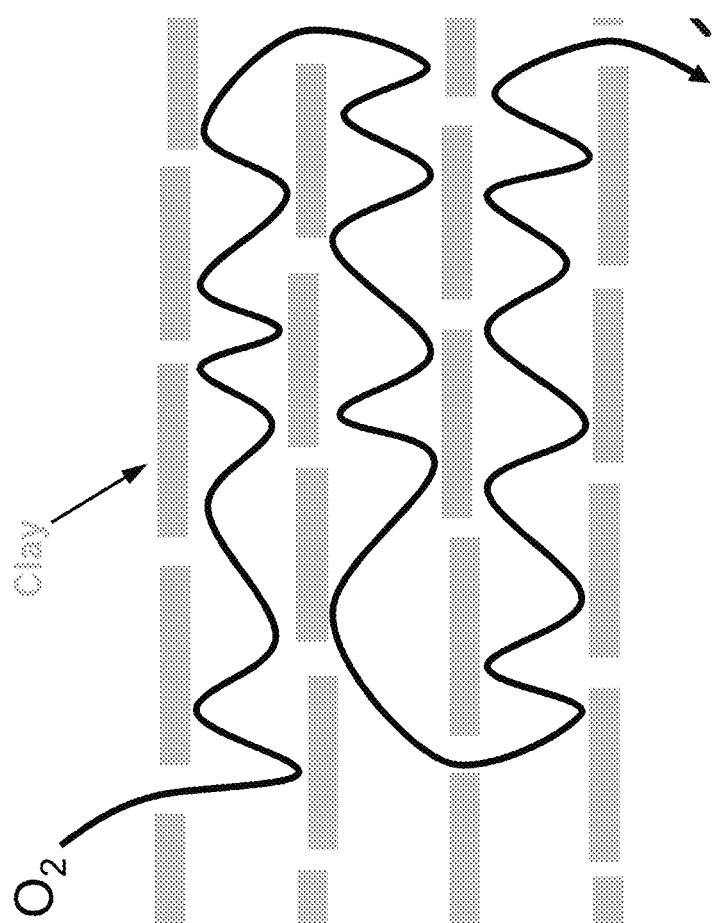
FIG. 2 is a schematic illustration of the tortuous path of an $O_2$ molecule permeating through a polymer-clay composite. See M. Priolo et al., *Nano Lett.* 10, 4970 (2010).

The oriented layers of clay platelets in the polymer matrix form a complex, tortuous pathway for the diffusion of gases, such as oxygen or water, as shown in FIG. 2, creating a remarkably effective gas barrier in films typically less than 200 nm thick. PCN oxygen transmission rates can be less than 0.1 $cc/m^2/day$ and moisture transmission rates can be less 0.0.8 $g/m^2/day$. These rates are each >10× improvements over EVA. See M. Priolo et al., *ACS Appl. Mater. Interfaces* 2(1), 321 (2010); M. Priolo et al., *Nano Lett.* 10, 4970 (2010); and M. Priolo et al., *ACS Appl. Mater. Interfaces* 4, 5529 (2012).

The PCN coatings can also provide an ion-transport barrier in PV modules. This is especially important in reducing "potential induced degradation" that involves the migration of ions through the cells under applied (or induced) potentials. When properly integrated within the cells, the PCN coatings can reduce this degradation mode.

These PCN films can also impart significant resistance to corrosion, both by serving as a barrier to corrosive molecular species, but also through direct molecular interactions of select polymers (e.g., PAA) on a metal surface. Preliminary studies have shown that a PCN film deposited on copper coupons show dramatically reduced copper corrosion in an aggressive corrosive test atmosphere.

In addition to the favorable gas permeation, corrosion resistance, and ion-transport barrier capabilities of these materials, the nanocomposite films are optically transparent. Clays, such as MMT or VMT, do not significantly absorb visible light, and the ordered, ultrathin character of these composite thin films makes them highly transparent (e.g., ≥95% transparent across the visible spectrum for 20-bilayer films), a critical feature for a PV encapsulant. See M. Priolo et al., *ACS Appl. Mater. Interfaces* 4, 5529 (2012).

Increased PV installations on buildings have also raised new concerns about PV-related fires, such as those resulting from high voltage arc-faults. Interconnect defects resulting, for example, from corrosion in poorly encapsulated modules, can initiate high-voltage arcs which can ignite flammable back-sheets and encapsulants. Arc-faults resulting from internal wiring failures or device degradation can produce catastrophic fires that damage equipment and property and endanger both consumers and emergency personnel endeavoring to extinguish fires when confronted with active high voltage PV modules. Subsequent perception of fire-related risk can drive up PV LCOE through increased cost of system financing or insurance and can delay large-scale adoption of PV. The PCN-based technology provides enhanced encapsulant performance, excellent fire retardant properties, and improved arc-fault flammability resistance. See G. Laufer et al., *ACS Appl. Mater. Interfaces* 4, 1643 (2012); and Y. Li et al., *ACS Nano* 4, 3325 (2010). Preliminary arc-flammability tests of PCN films on polyesters show that time to flame more than doubles on PCN-coated substrates with expected improvement to a 10× increase in time to flame with optimized PCN films, ensuring significant improvement in arc-fault-related safety.

Finally, the flexible thin-film character of these materials also makes them ideal conformal coatings on irregular and textured surfaces. As such, these materials can be applied as conformal barrier layers on module backsheets, complementary encapsulant layers, active material layers, electronic structures, microtextured antireflective coatings or glass covers. They can be employed in rigid or flexible PV systems, and integrated not only as planar layers within a module, but also as edge-sealants applied after assembly. In addition to use as an encapsulant, the PCN coating can also be applied to a variety of interfaces within a module to tailor the barrier properties; multiple PCN coatings can be introduced with varied properties, depending on what function they need to perform in the cell. Finally, although the above description relates primarily to the application of PCN coatings to PV modules, the coatings can also be applied to "balance of systems hardware" (e.g., inverters) to address significant degradation, failures, and even arc-faults in these other components.

The PCN thin films can be deposited by layer-by-layer (LBL) deposition to provide encapsulation of PV modules. The highly scalable LBL method comprises deposition of alternating molecular layers of charged polymer (e.g., polyethyleneimine) and oppositely charged exfoliated clay platelets (e.g., montmorillonite). Repeated, sequential additions of molecular layers of polymer and clay platelets (each ~1 nm thick), allows for the highly controlled assembly of the "brick and mortar" thin film structure shown in FIG. 1. The PCN films can be deposited on transparent substrates, nanoporous substrates, or substrates with well-known gas permeation properties to optimize the number and repeat pattern of LBL layers as well as the clay and polymer compositions based on optical transparency, oxygen transmittance, water vapor transmittance, and environmental film stability (temperature, humidity, UV-exposure, etc.). Alternative deposition approaches, such as non-aqueous LBL deposition, dip-coating, reel-to-reel deposition, spray-coating processes, and film-transfer from sacrificial substrates can also be used with minimal changes to existing module manufacturing processes.

The chemistry and nanostructured morphology of these materials can be characterized using FTIR spectroscopy, UV-Vis spectroscopy, elemental analysis atomic force microscopy, and high resolution scanning and transmission electron microscopy. Materials properties, such water vapor, oxygen transmission, and chemisorption, can be characterized using a gas permeation tester. Arc-fault testing of film structures can be evaluated using a test instrument capable of evaluating properties such as time to smoke and time to flame for materials exposed to controlled high voltage arcing. Finally, PCN thin films assembled on functional PV test modules can be evaluated by both in-situ PV characterization on environmental module test structures and full module testing under accelerated or artificially controlled conditions (e.g., thermal variation, damp heat, etc.). These tests can provide information about the structural, chemical, and optical stability of these coatings, integrated with a functional PV module. Through enhanced encapsulant performance, annual module degradation rates can be decreased, for example from 1% to 0.5%, resulting in a doubling of functional module lifetime, and a direct reduction of PV LCOE across consumer, commercial, and utility scale applications. See C. Osterfeld et al., *Prog. Photovoltaics: Res. and Appl.* 17, 11 (2009). Maintaining a higher effective power output and increased module lifetime will not only contribute to a reduced LCOE, but also stands to increase the internal rate of return on capital investments from commercial and utility-based investors.

The present invention has been described as a nanocomposite barrier film for photovoltaic applications. It will be understood that the above description is merely illustrative of the applications of the principles of the present invention, the scope of which is to be determined by the claims viewed in light of the specification. Other variants and modifications of the invention will be apparent to those of skill in the art.

We claim:

1. A layered nanocomposite barrier film for the encapsulation of solar photovoltaics, comprising at least one layer of dispersed and aligned clay platelets in a polyelectrolyte polymer matrix encapsulating a photovoltaic module.

2. The barrier film of claim 1, wherein the clay platelets are anionic and the polyelectrolyte polymer is cationic.

3. The barrier film of claim 2, wherein the anionic clay platelets comprise montmorillonite or vermiculite.

4. The barrier film of claim 2, wherein the cationic polyelectrolyte polymer comprises polyethyleneimine or ethylene vinyl amine.

5. The barrier film of claim 1, wherein the clay platelets are cationic and the polyelectrolyte polymer is anionic.

6. The barrier film of claim 5, wherein the cationic clay platelets comprise layered double hydroxides.

7. The barrier film of claim 5, wherein the anionic polyelectrolyte polymer comprises poly(acrylic acid).

8. The barrier film of claim 1, wherein the polyelectrolyte polymer matrix comprises a combination of oppositely charged polymers.

9. The barrier film of claim 8, wherein the oppositely charged polymers comprise polyethyleneimine and poly(acrylic acid).

10. The barrier film of claim 1, wherein the barrier film further comprises at least one layer of dispersed and aligned platelets of alumina, graphene, or boron nitride.

11. The barrier film of claim 1, wherein the barrier film further comprises a polymeric encapsulant.

12. The barrier film of claim 11, wherein the polymeric encapsulant comprises ethylene vinyl acetate, polyvinyl butyral, a polyolefin, an ionomer, or a silicone.

13. The barrier film of claim 1, wherein the barrier film is deposited by a layer-by-layer process.

* * * * *